(12) United States Patent
Lou

(10) Patent No.: US 6,784,098 B1
(45) Date of Patent: Aug. 31, 2004

(54) METHOD FOR FORMING SALICIDE PROCESS

(75) Inventor: Chine-Gie Lou, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/845,477

(22) Filed: Apr. 30, 2001

(51) Int. Cl.$^7$ .......................................... H01L 21/4763
(52) U.S. Cl. .................. 438/645; 438/585; 438/592; 438/642; 438/652; 438/655; 438/682; 438/692
(58) Field of Search .................. 438/305, 585, 438/592, 642, 645, 646, 648, 649, 652, 655, 660, 664, 682, 683, 692

(56) References Cited

U.S. PATENT DOCUMENTS

| | | | | |
|---|---|---|---|---|
| 5,064,683 A | * | 11/1991 | Poon et al. ................. | 427/569 |
| 5,268,330 A | * | 12/1993 | Givens et al. .............. | 438/586 |
| 5,385,866 A | * | 1/1995 | Bartush ...................... | 438/595 |
| 5,731,239 A | | 3/1998 | Wong et al. ................ | 438/296 |
| 5,858,870 A | * | 1/1999 | Zheng et al. ............... | 438/622 |
| 6,136,700 A | * | 10/2000 | McAnally et al. .......... | 438/666 |
| 6,140,216 A | | 10/2000 | Richart et al. ............. | 438/592 |
| 6,146,994 A | | 11/2000 | Hwang ....................... | 438/633 |
| 6,153,485 A | | 11/2000 | Pey et al. ................... | 438/305 |
| 6,162,691 A | | 12/2000 | Huang ........................ | 438/300 |
| 6,177,336 B1 | | 1/2001 | Lin et al. .................... | 438/592 |
| 6,180,501 B1 | * | 1/2001 | Pey et al. ................... | 438/592 |
| 6,187,675 B1 | * | 2/2001 | Buynoski .................... | 438/655 |
| 6,391,767 B1 | * | 5/2002 | Huster et al. ............... | 438/630 |

OTHER PUBLICATIONS

Stanley Wolf "Silicon Processing for the VLSI Era", 1990, vol. 2, pp. 143–150.*

* cited by examiner

*Primary Examiner*—Maria Guerrero
(74) *Attorney, Agent, or Firm*—George O. Saile; Stephen B. Ackerman

(57) ABSTRACT

A new method is provided for forming salicided surfaces to a FET device. Gate electrodes are formed including Ti/TiN salicided contact surface regions thereto. A thin layer of silicon oxide and a thick layer of photoresist are deposited. The layer of photoresist is polished, stopping on a top layer of BN of the gate electrode. The exposed layer of BN is removed. A thick layer of Ti/TiN is next deposited and annealed, forming $TiSi_x$ after which unreacted Ti/TiN is removed. A high temperature anneal is applied to reduce the sheet resistance of the layer of $TiSi_x$. As an alternate approach to the above cited sequence the layer of photoresist can be replaced with a layer of boro-phosphate-silicate-glass (BPSG), the layer of BN can be replaced with a layer of silicon nitride.

11 Claims, 5 Drawing Sheets

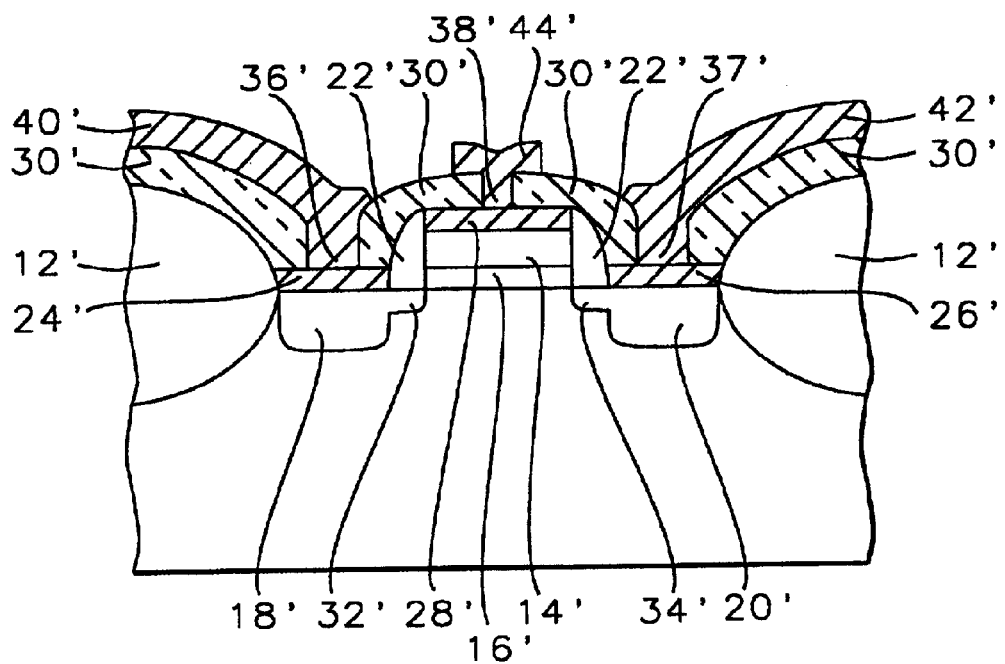
FIG. 1 – Prior Art
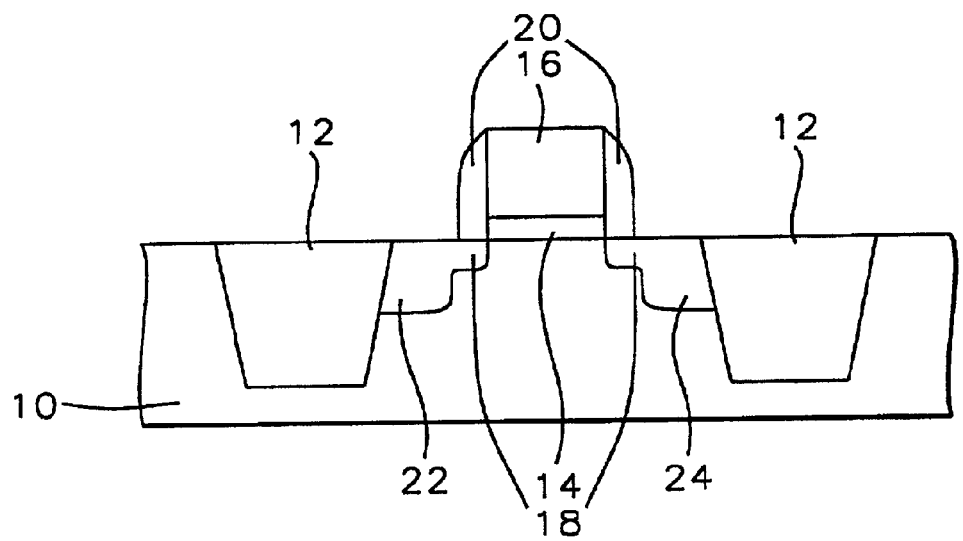
FIG. 2

METHOD FOR FORMING SALICIDE PROCESS

BACKGROUND OF THE INVENTION (1) Field of the Invention

The invention relates to the fabrication of integrated circuit devices, and more particularly, to a method of performing the process of salicidation.

(2) Description of the Prior Art

The continuing trend in the semiconductor industry for device performance improvements has resulted over the years in dramatically reducing devices features and device interconnect lengths and in increasing device packaging density. One type of semiconductor device on which this trend has had a major impact is the Field Effect Transistor (FET), which has found extensive application in the era of Ultra Large Scale Integration (ULSI) of semiconductor devices.

FET devices are typically created over an active surface region of a silicon substrate by first growing a thin layer of gate oxide, which serves as a stress relieve layer between the FET device and the underlying silicon substrate. A layer of typically polysilicon is deposited over the layer of gate oxide and patterned to form the body of the gate electrode that is an integral part of the FET. Impurity implants are then performed into the surface of the underlying silicon substrate, which are self-aligned with the gate electrode of the FET, to determine the conductivity of the surface of the substrate and therewith the performance characteristics of the FET. These impurity implants are known as Lightly Doped Diffusions (LDD) and the implants for the source and drain regions of the FET. Gate spacers are typically formed on the sidewalls of gate electrode, the source and drain implants are in this case performed after the gate spacers have been created.

With continued miniaturization of the FET, the channel length of the FET, which is the distance between the source and the drain region of the gate electrode as measured along the surface of the substrate, continues to decrease in value to where this value approaches 0.25 µm.

With the overall scaling down of the FET supporting elements, such as the source/drain implants of the FET, must also be proportionally reduced. The FET is interconnected to surrounding circuitry by establishing electrical contacts with the source/drain regions of the gate electrode and with the surface of the layer of polysilicon that forms the body of the gate electrode. With reduced device dimensions and the therewith reduced depth of implant of the source/drain impurities, it stands to reason that the surface contact that is established with the source/drain regions becomes relatively more important. Specifically, this surface contact must be a low resistivity contact in order to avoid a negative impact on device performance. This low resistivity can be established by forming a thin silicide layer over the surface of the source/drain regions and the surface of the layer of polysilicon of the FET device, using a process that is known as salicidation. The method of self-aligned silicide (salicide) formation, which self-registers with the contacts at the top of the polysilicon gate, the source and the drain, helps solve the problem of critical dimension tolerance.

For advanced FET devices, which have a channel length of 0.25 µm or less, it is difficult for the conventional process of salicidation to simultaneously meet the requirements of ultra shallow junction depth and of low sheet resistivity of the surface of the contact regions. Junction leakage can be reduced by reducing the thickness of the layer of silicide, this however increases the sheet resistivity. The invention provides a method that addresses these concerns.

U.S. Pat. No. 6,140,216 (Richart et al.) shows a silicide S/D CMP to expose gate and Silicide gate top.

U.S. Pat. No. 5,731,239 (Wong et al.), U.S. Pat. No. 6,177,366 (Lin et al.), U.S. Pat. No. 6,162,691 (Huang), U.S. Pat. No. 6,146,994 (Hwang) and U.S. Pat. No. 6,153,485 (Pey et al.) show related silicide processes.

SUMMARY OF THE INVENTION

A principle objective of the invention is to provide a method of salicidation whereby uniform polishing of the salicided surfaces is maintained.

Another objective of the invention is to provide a method of salicidation whereby endpoint detection of polishing of the salicided surfaces does not present a problem.

Yet another objective of the invention is to provide a method of salicidation whereby polishing of the salicided surface can be performed using relatively relaxed parameters of polishing time, that is providing a relatively wide "processing window" for the polishing operation.

In accordance with the objectives of the invention a new method is provided for forming salicided surfaces to a FET device. Gate electrodes are formed, including the formation of silicon oxide gate spacers and the source/drain region implants. The gate electrode consists, for the first embodiment of the invention, of stacked layers of silicon oxide (pad oxide), polysilicon and boronitride (BN). A thin layer of Ti/TiN is deposited, a low temperature anneal is performed creating salicided surfaces of the source/drain regions. A selective wet etch removes unreacted Ti/TiN, a thin layer of silicon oxide is deposited (liner oxide). A thick layer of photoresist, filling the spaces between the gate electrodes and extending above the upper layer of BN of the gate electrodes. The layer of photoresist is polished, stopping on the layer of BN, the surface of the layer of BN is now exposed, the layer of BN is removed. A thick layer of Ti/TiN is next deposited, filling the opening from where the layer of BN has been removed. A low temperature anneal anneals the layer of Ti/TiN with the underlying polysilicon of the gate electrode, forming TiSi$_x$ in the region where the layer of Ti/TiN is in contact with the polysilicon of the gate electrode. The unreacted Ti/TiN is removed with a selective wet etch, leaving the layer of thick TiSi$_x$ in place overlying the gate electrode. A high temperature anneal is applied to reduce the sheet resistance of the layer of TiSi$_x$.

As an alternate approach to the above cited sequence, forming the second embodiment of the invention, the function of the layer of photoresist can be replaced with a layer of boro-phosphate-silicate-glass (BPSG), the function of the top layer of BN can be replaced with a layer of silicon nitride.

BRIEF DESCRIPTION OF THE DRAWINGS

FIG. 1 shows a cross section of a conventional gate electrode structure.

FIGS. 2 through 7 address the first embodiment of the invention, as follows:

FIG. 2 shows a cross section of a gate electrode formed on the active surface region of a semiconductor substrate, the gate electrode consists of a layer of pad oxide and a layer of polysilicon.

FIG. 3 shows a cross section after a thin layer of Ti/TiN has been deposited and annealed, creating salicided surfaces over the source/drain regions of the gate electrode, unreacted Ti/TiN has been removed from the surface. A thin liner of silicon nitride has been deposited, a thick layer of BPSG has been deposited.

FIG. 4 shows a cross section after the surface of the layer of BPSG has been polished down to the surface of the layer of silicon nitride.

FIG. 5 shows a cross section after the layer of silicon nitride has been removed from the surface of the gate electrode, using RIE processing.

FIG. 6 shows a cross section after a thick layer of Ti/TiN has been deposited. This layer is annealed by applying a low temperature anneal.

FIG. 7 shows a cross section after the uncreated Ti/TiN has been removed from the surface, the reacted Ti/TiN remains in place overlying the gate electrode and is further annealed using a high temperature anneal.

FIG. 8 shows a cross section of a gate electrode formed on the active surface region of a semiconductor substrate, the gate electrode consists of a layer of pad oxide, a layer of polysilicon and a layer of boronitride (BN).

FIG. 9 shows a cross section after a thin layer of Ti/TiN has been deposited and annealed, creating salicided surfaces over the source/drain regions of the gate electrode, unreacted Ti/TiN has been removed from the surface. A thin liner of silicon oxide has been deposited, a thick layer of photoresist has been deposited.

FIG. 10 shows a cross section after the surface of the layer of photoresist has been polished down to the surface of the layer of boronitride.

FIG. 11 shows a cross section after the layer of boronitride has been removed from the surface of the gate electrode, using RIE processing.

FIG. 12 shows a cross section after a thick layer of Ti/TiN has been deposited. This layer is annealed applying a low temperature anneal.

FIG. 13 shows a cross section after the uncreated Ti/TiN has been removed from the surface, the reacted Ti/TiN remains in place overlying the gate electrode and is further annealed using a high temperature anneal.

DESCRIPTION OF THE PREFERRED EMBODIMENTS

Figure 3:
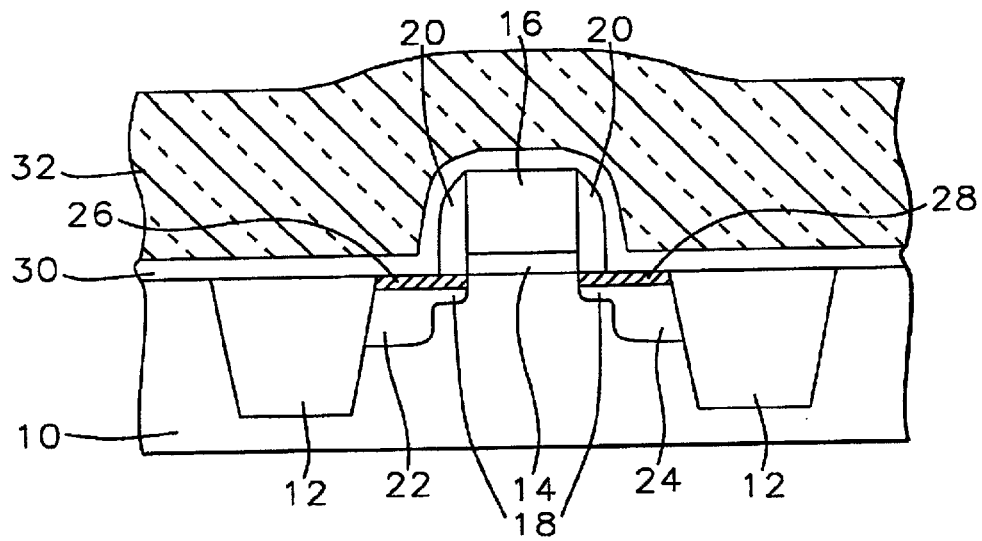

A typically process of salicidation for instance uses titanium which is deposited on the exposed upper surfaces of the source/drain regions and the gate region and annealed, thereby causing the titanium to react with the underlying silicon of the substrate source/drain regions and the doped polysilicon gate to form titanium salicide on these surfaces.

There are, however, problems associated with prior art methods of salicide formation one main problem is that the salicidation process of converting a refractory metal to its silicide is achieved by the consumption of silicon underlying the metal, and this means the consumption of substrate silicon in the regions of the source and drain. The source/drain junctions, already very shallow in sub-half-micron devices, can become unpredictably extremely thin. A further and very severe problem is that the salicidation reaction can consume substrate silicon unevenly, leading to ragged source/drain junctions and, even worse, the creation of spikes that can penetrate through the junctions near the edges of the source/drain areas. Furthermore, the salicided layer that is formed on the source/drain regions and on the polysilicon gate electrode must be wide enough to accommodate the photolithographic limitations in the contact opening, this results in a wider device. Also, since silicon is consumed in this process, the junction depth of the source/drain regions is difficult to control and dopant depletion can occur in these regions. Furthermore, formation of the deep, heavily doped junction for the source/drain regions can result in dopant diffusion under the gate region thereby reducing the effective channel length of the FET causing the so-called "short channel effect".

The ability to achieve successful salicide formation is dependent on the integrity of the insulator spacers, on the sides of the polysilicon gate structure, during the salicide formation procedure. For example prior to metal deposition, native oxide on the exposed top surface of the polysilicon gate structure, as well as the top surface of the source and drain region, has to be removed, to allow the subsequent metal silicide formation to be successful. Native oxide will prevent the reaction between the metal and the exposed silicon surfaces during an anneal cycle. Therefore a buffered hydrofluoric acid procedure is used prior to metal deposition. However if, as a result of the buffered hydrofluoric acid metal pre-cleaning procedure, the insulator spacer (on the sides of the polysilicon gate structure) becomes defective or significantly thinned, thereby exposing polysilicon, the formation of unwanted metal silicide or bridging of the metal silicide can occur on the sides of the polysilicon gate structure. This results in gate to substrate shorting or leakage.

For advanced FET devices, which have a channel length of 0.25 $\mu$m or less, it is difficult for the conventional process of salicidation to simultaneously meet the requirements of ultra shallow junction depth and of low sheet resistivity of the surface of the contact regions. The junction leakage can be reduced by reducing the thickness of the layer of silicide, this however increases the sheet resistivity. Another approach is to form salicided layers over the surface of the source/drain regions which have a thickness that is different from the thickness of the salicided layer that is created over the surface of the gate electrode. This however brings with it problems of polishing using methods of Chemical Mechanical Polishing (CMP) of these surfaces, specifically problems of CMP endpoint detection and CMP uniformity over these relatively thin surfaces. The invention provides a method for the creation of salicided layers whereby problems of CMP endpoint detection and CMP uniformity of salicided layers are avoided.

The problems that are encountered using conventional processes of salicidation, in addition to the issues that have been highlighted above, can be summarized as follows:

high cost of the salicidation process failure of the CMP endpoint detection during the process of polishing the salicided surfaces serious erosion of the surface of the polysilicon gate electrode difficult to maintain CMP uniformity across the surfaces that have been salicided damage is incurred by the surface of the gate electrode, this damage can be caused by the process of PVD of the titanium that is used for the salicidation (causing pitting in the surface of the gate electrode) or can be caused by poor quality of the salicided surface bridging can occur between surface of the gate electrode and the salicided surface of the source/drain regions due to incomplete removal of the unreacted metal and the therefrom following presence of salicide "stringers".

A prior art method of creating a FET is first briefly reviewed in order to provided a reference for the invention. FIG. 1 gives an overview of the self-aligned source, drain and gate salicide formation. This process starts with the surface of a semiconductor substrate 10', FIG. 1. Forming insulation regions 12' that bound the active region isolates the active region that is to be used for the creation of, for instance, a gate electrode. Field Oxide (FOX) isolation regions 12' can be used to electrically isolate the discrete devices, such as Field Effect Transistors (FET's) in ULSI circuits on semiconductor chips formed from silicon substrate. One conventional approach in the semiconductor industry for forming field isolation is by the Local Oxidation of Silicon (LOCOS) method. LOCOS uses a patterned silicon nitride ($Si_3N_4$) as an oxidation barrier mask, the silicon substrate is selectively oxidized to form the semiplanar isolation. However, this method requires long oxidation times (thermal budget) and lateral oxidation under the barrier mask limits the minimum spacing between adjacent active device areas, and therefore prevents further increase in device packaging density.

One method of circumventing the LOCOS limitations and to further reduce the field oxide (FOX) minimum features size is to allow shallow trench isolation (STI). One method of making STI is to first etch trenches having essentially vertical sidewalls in the silicon substrate. The trenches are then filled with a CVD of silicon oxide ($SiO_2$) and the $SiO_2$ is then plasma etched back or polished back using CMP, to form the FOX isolation region. These regions are indicated as regions 12' in FIG. 1.

A thin layer 16' of gate oxide is grown over the surface of the substrate 10' on the active device region. To create the gate structure, a layer 14' of polysilicon is grown over the thin layer 16' of gate oxide. The polysilicon layer 14' is masked and the exposed polysilicon 14' and the thin layer 16' of oxide are etched to create the polysilicon gate 14' that is separated from the substrate by the remaining thin layer of oxide 16'. The doping of the source/drain regions starts with creating the lightly N+ doped diffusion (LDD) regions 32'/34'. The sidewall spacers 22' for the gate structure are formed after which the source and drain region doping is completed by doping the source/drain regions 18'/20' to the desired level of conductivity using a N+ dopant.

Contact points to the source/drain regions and the electrode gate are then formed by first selectively depositing a layer of titanium (not shown) over the surface of the source/drain regions and the top surface of the gate electrode. This titanium is annealed causing the deposited titanium to react with the underlying silicon of the source/gain regions and the doped surface of the gate electrode. This anneal forms layers of titanium silicide 24'/26' on the surfaces of the source/drain regions and layer 28' on the top surface of the gate electrode.

The metal contacts with the source/drain regions and the gate electrode are formed as a final step. A dielectric 30' such as silicon oxide is blanket deposited over the surface of the created structure, patterned and etched to create contact openings 36'/37' over the source/drain regions and opening 38' over the top surface of the gate electrode. The metallization layer selectively deposited over the patterned dielectric establishes the electrical contacts 40'/42' with the source/drain regions and 44' with the top surface of the gate electrode.

The first embodiment of the invention is next described in detail using FIGS. 2 through 7.

FIG. 2 shows a cross section of a partially completed gate electrode, having the elements:

10, the surface of a monocrystalline silicon substrate 12, regions of Shallow Trench Isolation (STI) that have been formed in the surface of substrate 10 and that define and bound the active surface region of the surface of substrate 10

14, a thin layer of pad oxide overlying the surface of substrate 10, forming a buffer layer between the gate electrode 16 and the surface of substrate 10

16, the gate electrode, typically comprising polysilicon

18, Lightly doped Diffusion (LDD) regions that have been implanted into the surface of substrate 10 self-aligned with the gate electrode structure 14/16

20, gate spacers formed on the sidewalls of gate electrode 14/16

22, source region impurity implant provided into the surface of the substrate 10, self-aligned with the gate electrode 14/16

24, drain region impurity implant provided into the surface of the substrate 10, self-aligned with the gate electrode 14/16.

STI regions 12 can be made using a number of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.5 and 0.8 micrometer ($\mu$m) deep. STI regions are typically formed around the active device to a depth between 4,000 and 20,000 Angstrom.

Another approach in forming STI regions 12 is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride is provided to the silicon to prevent polishing of the masked silicon oxide of the device.

The layer 14 of pad oxide is grown on the bare silicon after the silicon surface has been cleaned. The layer consists of an about 150 Angstrom thick layer of $SiO_2$ and can be thermally grown on the surface of the substrate 10. The purpose of this layer 14 is to cushion the transition of the stress between the silicon substrate 10 and the subsequently deposited layer of polyimide for the formation of the gate electrode. In general, the thicker the layer 14 of pad oxide, the less edge force is being transmitted to the silicon substrate 10. Typically, a blanket pad oxide can be formed to a thickness of about 150 Angstrom through a thermal oxidation method at a temperature of about 900 degrees C. for a time period of about 10 to 20 minutes.

Polysilicon layer 16 is typically deposited using low-pressure vapor deposition (LPCVD) using, for example, silane ($SiH_4$). The thickness of polysilicon layer 16 is between 1,500 and 3,000 Angstrom.

The layer of polysilicon can be doped as follows:

for NMOS: N+ doped using As or P as a dopant with a dopant concentration of between about $1\times10^{15}$ and $1\times10^{20}$ atoms/$cm^3$ for PMOS: P+ doped using $BF_2$ or B as a dopant with a dopant concentration of between about $1\times10^{15}$ and $1\times10^{20}$ atoms/$cm^3$.

After the gate structure 14/16 has been formed LDD implants 18 are performed in order to reduce or eliminate the occurrence of leakage current between the gate electrode and the underlying silicon substrate. As typical LDD implant conditions can be cited an LDD implant for a NMOS device using arsenic with an energy within the range of between 1 to 10 keV and a dose within the range of between 1e14 to 1e16 atoms/cm². Also, an LDD implant for a PMOS implant using $BF_2$ with an energy within the range of between 1 to 10 keV and a dose within the range of between 1e14 to 5e15 atoms/cm².

Gate spacers 20 are formed next. By forming silicon oxide spacers 20 on the sidewalls of the gate electrode, deposited metal does not interact with the sidewalls of the gate electrode and separate points of electrical contact can be formed for the source/drain regions and the surface of the gate electrode. Gate spacers 20 are formed in the sidewalls of the body of the gate electrode by a blanket CVD deposition of a layer of silicon oxide over the surface of the gate electrode and its surrounding area. Silicon oxide spacers 20 can then be formed via anisotropic Reactive Ion Etch (RIE) of the silicon oxide layer, using $CHF_3$ or $CF_4$—$O_2$—He as an etchant.

Source/drain regions 22/24 are next implanted into the surface of substrate 10, self aligned with the gate electrode 14/16 and the gate spacers 20 that have been formed on the sidewalls of the gate electrode 14/16. Typical conditions for implants 22/24 are as follows:

| For NMOS: | As  | energy: | 15 to 100 keV |
|           |     | dose:   | 1e14 to 5e16 atoms/cm² |
|           | P   | energy: | 10 to 100 keV |
|           |     | dose:   | 1e16 to 5e16 atoms/cm² |
| For PMOS: | B   | energy: | 1 to 50 keV |
|           |     | dose:   | 1e13 to 1e16 atoms/cm² |
|           | BF2 | energy: | 5 to 180 keV |
|           |     | dose:   | 1e13 to 1e16 atoms/cm² |

Next, FIG. 3, a thin layer (not shown in FIG. 3) of Ti/TiN is deposited over the structure of FIG. 2. The surface of the substrate 10 and the thereover deposited thin layer of Ti/TiN are then subjected to a low temperature anneal, forming the salicided regions 26 (over the source region 18/22) and 28 (over the drain region 18/24) of the gate electrode 14/16. The thin layer of Ti/TiN (not shown) is preferred to be deposited to a thickness between about 100 and 500 Angstrom and more preferably to a thickness of about 300 Angstrom.

The layer of Ti/TiN (not shown) can be deposited on the surface of the substrate to a thickness between about 300 to 600 Angstrom at a temperature of 25 to 300 degrees C. using either rf. sputtering or CVD techniques.

The low temperature anneal is rapid thermal annealing in a temperature range of between about 600 and 850 degrees C. for a time between about 20 and 60 seconds used to form reactant layers 26/28 of $TiSi_2$.

The unreacted Ti/TiN can be removed from the surface of the substrate with a selective etchback using a wet $NH_4OH$ and $H_2O_2$ solution. A CVD Ti/TiN may also be etched using a dry $CF_4$ and oxygen environment.

Next, FIG. 3, a silicon nitride liner 30 is deposited. The layer 30 of silicon nitride ($Si_3N_4$) can be deposited using LPCVD or PECVD procedures at a pressure between about 200 mTorr and 400 mTorr, at a temperature between about 600 and 800 degrees C., to a thickness of about 1500 to 3000 Angstrom using $NH_3$ and $SiH_4$ or $SiCl_2H_2$. The silicon nitride layer 30 can also be deposited using LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 200 and 300 Angstrom.

The deposition of layer 30 of silicon nitride is followed by the deposition of a layer 32 of boro-phosphate-silicate-glass (BPSG). A layer of BPSG is frequently used for the creation of a planar surface. BPSG can be formed as a spin-on material that can be cured after it has been deposited on a surface. BPSG can also be formed within a Chemical Vapor Deposition (CVD) chamber, often used with a plasma enhanced or plasma assisted environment. By heating the deposited BPSG (after it has been deposited) to a temperature of about 900 degrees C., the BPSG can be made to reflow thereby creating a surface of good planarity.

BPSG further has the desirable property of acting as an alkali ion getter and of forming a low stress surface. Care must be taken that the doping limit of BPSG does not exceed certain limits since BPSG can in that case become the source of unwanted diffusion to the underlying silicon. It has been found that BPSG is primarily a source of phosphorous and that the phosphorous out-diffusion increases with increased level of boron.

The layer 32 of BPSG is deposited to a thickness such that the gate structure and the overlying layer of silicon nitride are covered by the layer of BPSG and such that no valley or trough develops in the surface of the layer of BPSG between adjacent gate structures.

The surface of layer 32 of BPSG is then polished using methods of CMP, down to the surface of layer 30 of silicon nitride, using the surface of layer 30 as the stop layer for the CMP process. This results in the cross section that is shown in FIG. 4.

Figure 4:
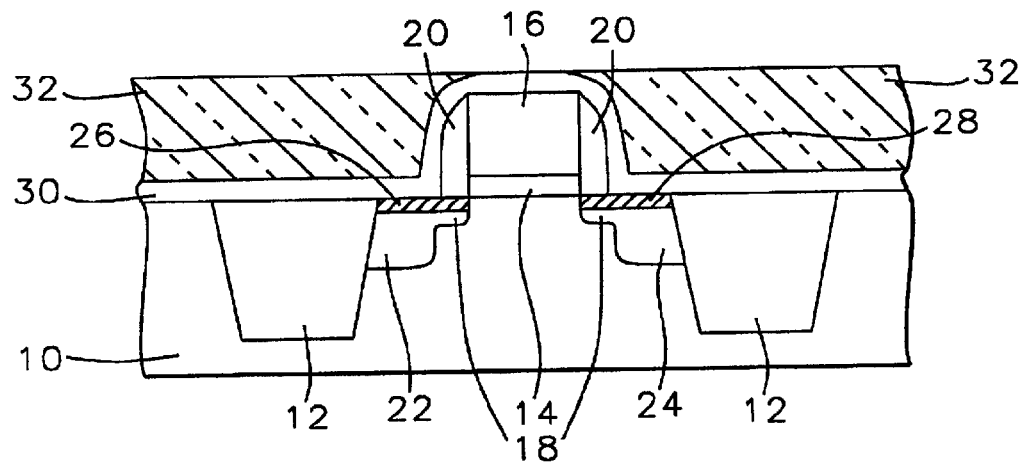

In the cross section that is shown in FIG. 4, it is clear that the surface of the layer 30 of silicon nitride is exposed where this layer overlays the gate electrode structure 14/16. This makes it possible to etch the layer 30 of silicon nitride over this exposed surface region and to remove the silicon nitride of layer 30 from above the gate electrode structure 14/16.

A layer of silicon nitride can be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. A silicon nitride layer can also be wet etched using a buffered oxide etchant (BOE). The BOE may comprise a mixed solution of fluoroammonium and fluorohydrogen (7:1) and phosphoric acid solution. A silicon nitride layer can also be dipped into phosphoric acid ($H_3PO_4$) to be removed. A nitride layer can also be removed by dipping the structure into hot phosphoric acid ($H_3PO_4$) (standard wet nitride removal)

The preferred method of the invention for the etching of layer 30 applies an anisotropic Reactive Ion Etch (RIE) using $CHF_3$ or $SF_6$—$O_2$ or $SF_6/HB_8$ as an etchant. This leads to a structure that is shown in cross section in FIG. 5. From this cross section it is clear that the RIE, which has been applied to remove the layer 30 from above the surface of the gate electrode 14/16, has also reduced the thickness of layer 32.

Figure 6:
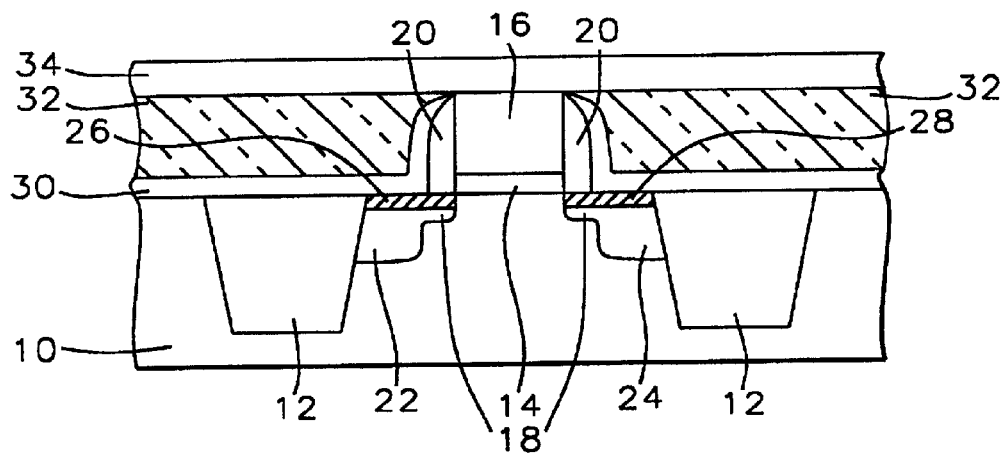

Over the surface of the layer 32, including the surface of the layer 16 of polysilicon of the gate electrode, is next deposited a thick layer 34 of Ti/TiN, as shown in cross section in FIG. 6. The layer 34 of Ti/TiN is deposited on the surface of the substrate to a thickness between about 2,000 to 5,000 Angstrom at a temperature of 25 to 300 degrees C. using either rf. sputtering or CVD techniques.

The layer 34 of Ti/TiN is then annealed with the surface of the layer 16 of polysilicon by applying a low temperature anneal to the substrate at a temperature of between about 600 and 850 degrees C. for a time between about 20 and 60 seconds used to form a reactant layer of TiSi$_x$ over the surface of the gate electrode 14/16 where the thick layer of Ti/TiN reacts with the underlying polysilicon. Where the thick layer of Ti/TiN is not in contact with the polysilicon this layer overlies the layer 32 of BPSG and no reaction will take place between the Ti/TiN of layer 34 and the BPSG of layer 32. The unreacted Ti/TiN can therefore be easily removed from the surface of the layer 32 of BPSG by applying a selective wet etch.

Figure 7:
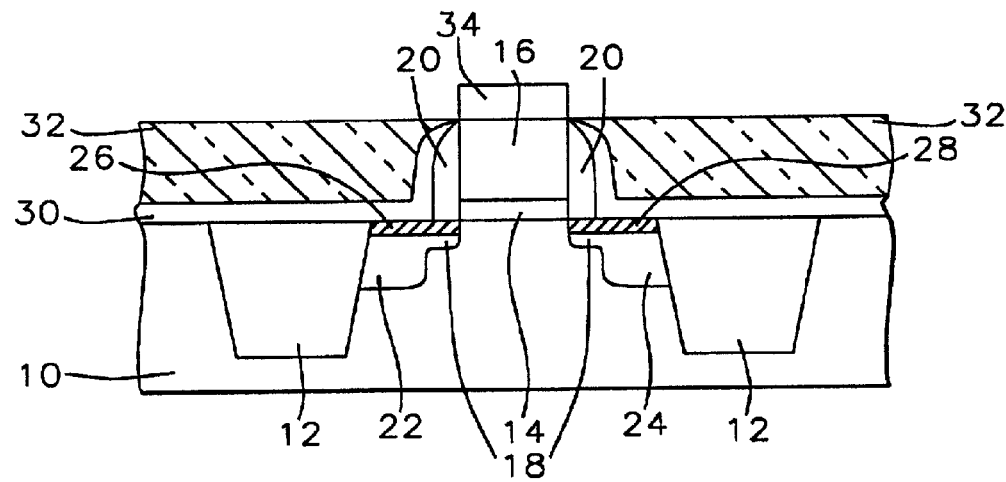

The unreacted Ti/TiN can be removed from the surface of layer 32 of BPSG with an etchback using a wet NH$_4$OH and H$_2$O$_2$ solution. A layer of CVD Ti/TiN may be etched using a dry CF$_4$ and oxygen environment. After the unreacted Ti/TiN ahs been removed in this manner, the cross section of the structure is as shown in FIG. 7.

As a final step of the first embodiment of the invention, a high temperature anneal is applied to the substrate which is rapid thermal annealing in a temperature range of between about 850 and 1000 degrees C. for a time between about 20 and 60 seconds used to reduce the sheet resistance of the reactant layers 26/28 of TiSi$_2$.

The second embodiment of the invention is next described in detail using FIGS. 8 through 13. The second embodiment of the invention has a number of processing steps that are identical with processing steps of the first embodiment of the invention. The provided description of the second embodiment of the invention will be made in as concise a manner as possible without leaving out required detail. It will be appreciated that processing conditions and the like that have been highlighted above for the first embodiment of the invention will not be repeated for the second embodiment of the invention.

Figure 8:
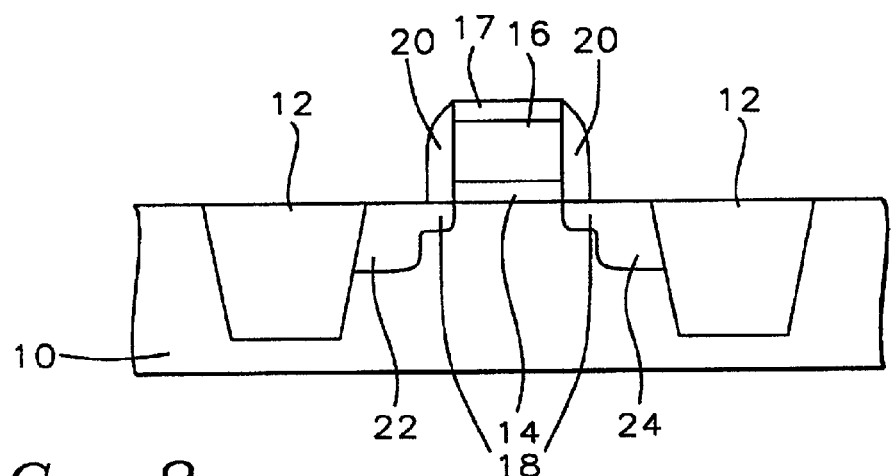
FIGS. 8 through 13 address the second embodiment of the invention, as follows.

FIG. 8 shows a cross section of a partially completed gate structure, this cross section is identical with cross section that is shown in FIG. 2 with the exception of the layer 17 of boronitride which forms the third and top layer of the gate electrode.

Figure 9:
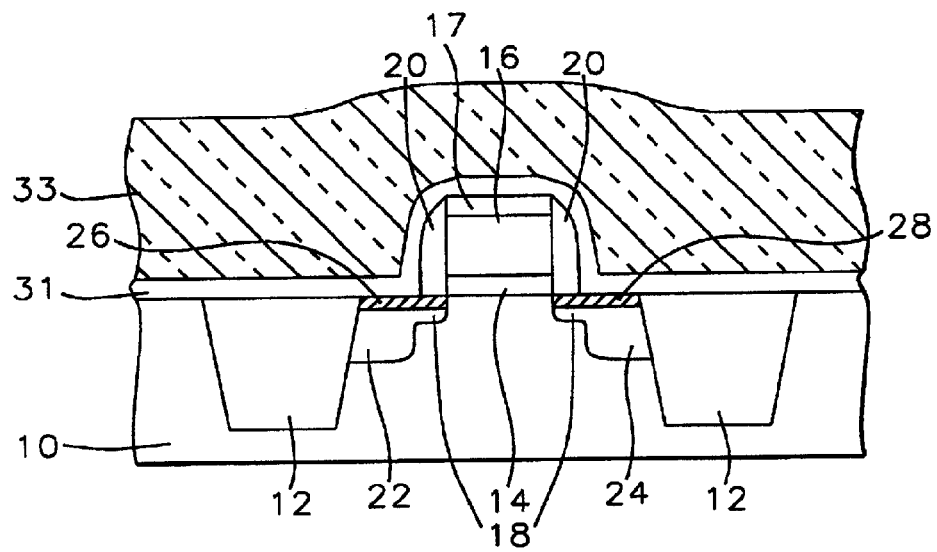

The cross section that is shown in FIG. 9 is identical with the cross section that is shown in FIG. 3 with the following exceptions:

layer 30 (FIG. 3) of silicon nitride is now (FIG. 9) layer 31 of silicon oxide layer 32 (FIG. 3) of BPSG is now layer 33 of photoresist.

Figure 10:
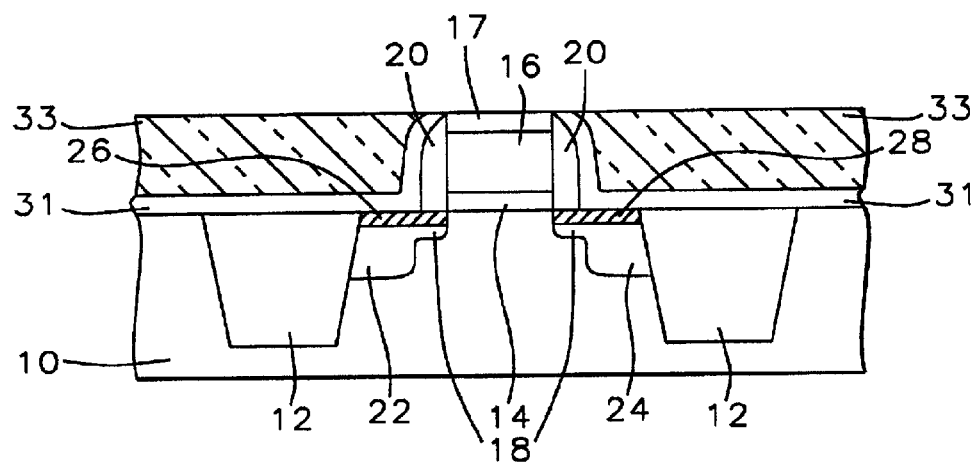

FIG. 10 is identical with the cross section that is shown in FIG. 4 with the exception that the polishing of the layer 33, of photoresist, is stopped using the surface of layer 17 of BN. This exposes the surface of the layer 17 of BN.

Figure 5:
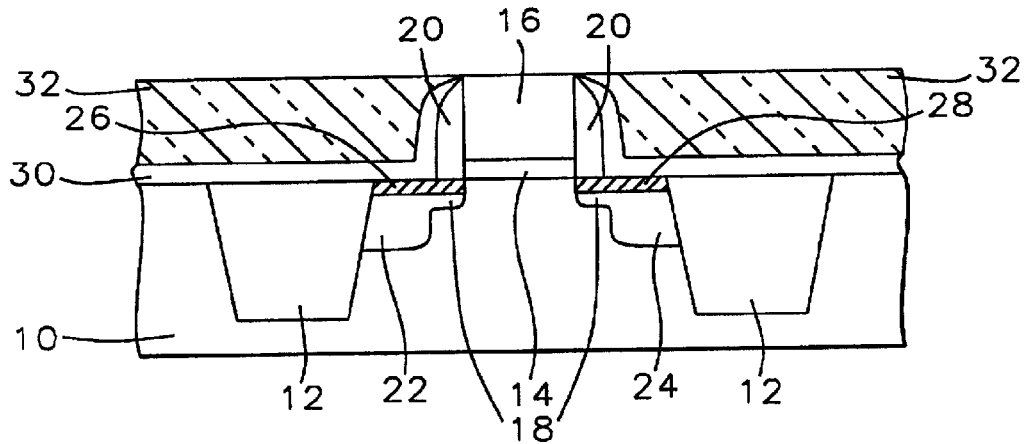
Figure 11:
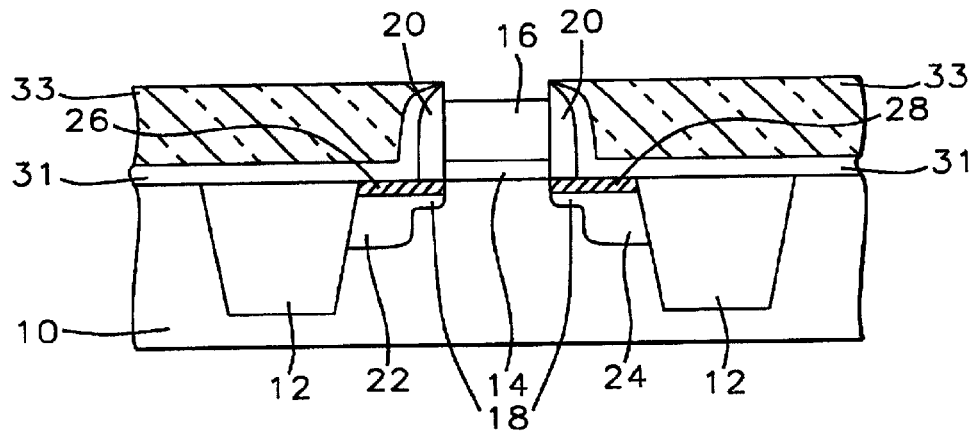

FIG. 11 is identical with the cross section that is shown in FIG. 5 with the exception that, where in FIG. 5 the layer of silicon nitride has been removed from the surface of the gate electrode, in the cross section that is shown in FIG. 11 the layer 17 of BN has been removed from the surface of the gate electrode.

Figure 12:
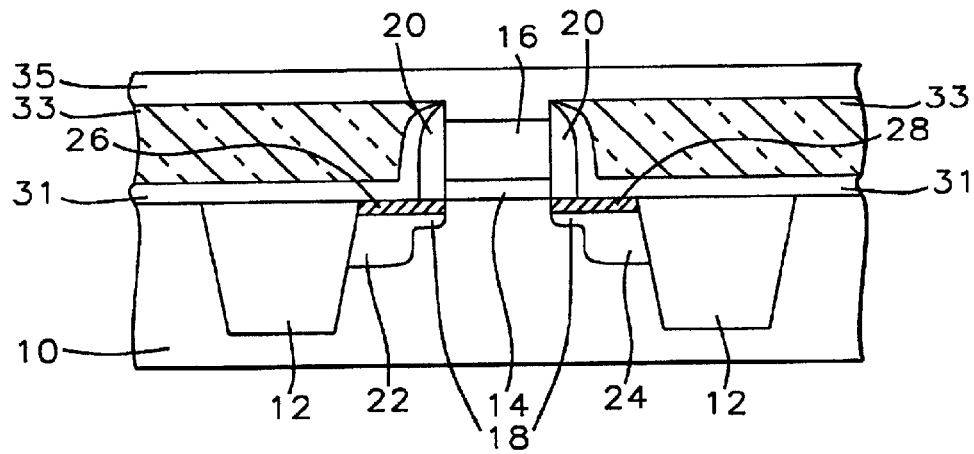

Proceeding with the cross section that is shown in FIG. 12, here, as in FIG. 6 of the first embodiment of the invention, a thick layer 35 of Ti/TiN has been deposited over the surface of the layer 33 of photoresist. The layer of Ti/TiN fills the opening that has been created in the surface of the gate electrode by the removal of later 17 of BN as shown in cross section in FIG. 11.

Figure 13:
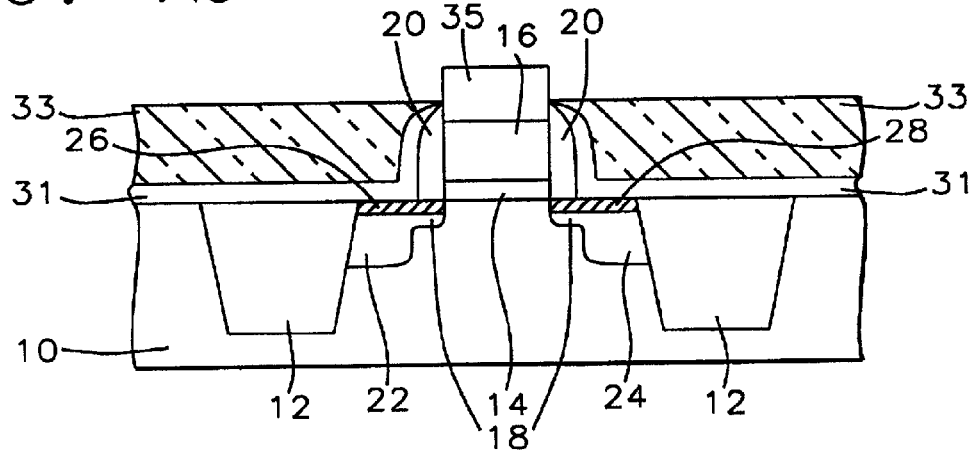

As a final step of the second embodiment of the invention, the layer 35, FIG. 13, of Ti/TiN is annealed at low temperature, converting the layer 35 of Ti/TiN into TiSi$_x$. The unreacted Ti/TIN is then removed from the surface by a selective wet etch. A final high temperature anneal of layer 35, FIG. 13, of TiSi$_x$ is performed, lowering the sheet resistance of this layer of TiSi$_x$ for improved contact resistance of the gate electrode.

To summarize the steps of the first embodiment of the invention:

a semiconductor substrate is provided

STI regions are defined in the surface of the substrate, bounding the active surface region of the substrate a gate electrode is formed of polysilicon overlying a layer of pad oxide, formed over the active surface region of the substrate LDD implants are performed self-aligned with the gate electrode gate spacers are formed on the sidewalls of the gate electrode source/drain implants are performed self-aligned with the spacers on the sidewalls of the gate electrode a thin layer of salicidation material comprising Ti/TiN is deposited over the surface of the substrate, including the surface of the gate electrode a low temperature anneal is applied to the deposited layer of Ti/TiN, forming salicided surface regions overlying the source/drain regions of the gate electrode a selective wet etch removes the unreacted Ti/TiN from the surface of the substrate a thin layer of silicon nitride is deposited over the surface of the substrate, including the exposed surface of the gate spacers and the top surface of the gate electrode a layer of BPSG is deposited over the layer of silicon nitride, thick enough to cover the entire layer of silicon nitride, including where this layer of silicon nitride overlays the gate electrode the surface of the layer of BPSG is polished down to the surface of the layer of silicon nitride where this layer of silicon nitride overlays the gate electrode, stopping on the surface of the layer of silicon nitride where this layer of silicon nitride overlays the gate electrode the silicon nitride is removed, using a RIE, where this layer of silicon nitride overlays the gate electrode, exposing the layer of polysilicon of the gate electrode a thick layer of Ti/TiN is deposited over the layer of BPSG, including the exposed layer of polysilicon of the gate electrode a low temperature anneal of the deposited layer of Ti/TiN is performed, forming TiSi$_x$ in the region where the layer of Ti/TiN is in contact with the polysilicon of the gate electrode a selective wet etch is performed to remove the unreacted Ti/TiN from the surface of the layer of BPSG a high temperature anneal is applied to the structure, decreasing the sheet resistance of the reacted TiSi$_x$.

The second embodiment of the invention can be summarized as follows:

a semiconductor substrate is provided

STI regions are defined in the surface of the substrate, bounding the active surface region of the substrate a gate electrode is formed of a stack of pad oxide, polysilicon and boronitride with the layer of boronitride (BN) being the top layer of the gate electrode, formed over the active surface region of the substrate LDD implants are performed self-aligned with the gate electrode gate spacers are formed on the sidewalls of the gate electrode source/drain implants are performed self-aligned with the spacers on the sidewalls of the gate electrode a thin layer of salicidation material comprising Ti/TiN is deposited over the surface of the substrate, including the surface of the gate electrode a low temperature anneal is applied to the deposited layer of Ti/TiN, forming salicided surface regions overlying the source/drain regions of the gate electrode a selective wet etch removes the unreacted Ti/TiN from the surface of the substrate a thin layer of silicon oxide is deposited over the surface of the substrate, including the exposed surface of the gate spacers and the top surface of the gate electrode a layer of photoresist is deposited over the layer of silicon oxide and thick enough to cover the entire layer of silicon oxide, including where this layer of silicon oxide overlays the gate electrode the surface of the layer of photoresist is polished down to the surface of the layer of boronitride which has been provided as the top layer of the gate electrode, stopping on the surface of the layer of boronitride the boronitride is removed from the stack of layers that forms the gate electrode a thick layer of Ti/TiN is deposited over the layer of BPSG including the exposed layer of polysilicon of the gate electrode a low temperature anneal of the deposited layer of Ti/TiN is performed, forming TiSi$_x$ in the region where the layer of Ti/TiN is in contact with the polysilicon of the gate electrode a selective wet etch is performed to remove the unreacted Ti/TiN from the surface of the layer of BPSG a high temperature anneal is applied to the structure, decreasing the sheet resistance of the reacted TiSi$_x$.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of fabricating field effect transistors having low sheet resistance gate electrodes, comprising the steps of:

providing a semiconductor substrate, said substrate having been provided with at least one gate electrode created over an active region of said substrate as defined by regions of Shallow Trench Isolation provided in said substrate, said at least one gate electrode having been provided with gate spacers, impurity implants of source and drain regions in addition to Lightly Doped Diffusion regions having been provided in said substrate self-aligned with said at least one gate electrode, said at least one gate electrode comprising a stack of layers of pad oxide created over said substrate, a layer of polysilicon patterned over the layer of pad oxide and a layer of boronitride patterned over the layer of polysilicon;

depositing a thin layer of salicide material over said substrate, including said gate spacers and said layer of polysilicon provided for said at least one gate electrode;

performing a first anneal, forming salicided layers comprising reacted salicide material over said source and drain implants;

first removing un-reacted salicide material from said substrate;

depositing an isolation film over said substrate, including said gate spacers and said layer of boronitride provided for said at least one gate electrode;

depositing a layer of filler material over said isolation film to a thickness such that said layer of filler material extends above said isolation film even where said isolation film overlays said at least one gate electrode, said depositing a layer of filler material comprises depositing a layer of photoresist;

polishing said layer of filler material and said layer of isolation film down to said layer of boronitride of said at least one gate electrode, using said layer of boronitride as a stop for said process of polishing, advantageously using a polishing rate of filler material that is larger than a polishing rate of boronitride, said layer of boronitride providing a save stop for said polishing the layer of filler material and the layer of isolation film, thereby further preventing corrosion of said at least one gate electrode;

removing said layer of boronitride from said at least one gate electrode, exposing said layer of polysilicon forming part of said at least one gate electrode;

depositing a thick layer of salicide material over said polished layer of filler material, including the exposed surface of said layer of polysilicon;

performing a second anneal of said deposited thick layer of salicide material, a layer of reacted salicide material overlying said layer of polysilicon of said at least one gate electrode;

second removing un-reacted salicide material from said layer of dielectric;

performing a third anneal, reducing the sheet resistance of said reacted salicide material overlying said layer of polysilicon of said at least one gate electrode.

2. The method of claim 1 wherein said depositing a thin layer of salicide material over said substrate comprises depositing a thin layer of Ti/TiN, deposited to a thickness between about 100 and 500 Angstrom.

3. The method of claim 1 wherein said first anneal is a low temperature anneal performed by rapid thermal annealing in a temperature range of between about 600 and 850 degrees C. for a time between about 20 and 60 seconds.

4. The method of claim 1 wherein said first removing said un-reacted salicide material from said substrate comprises performing a selective wet etch.

5. The method of claim 1 wherein said depositing an isolation film over said substrate comprises depositing a layer of silicon oxide.

6. The method of claim 1 wherein said removing said layer of boronitride from said at least one gate electrode comprises applying a Reactive Ion Etch.

7. The method of claim 1 wherein said depositing a thick layer of salicide material over said polished layer of filler material comprises depositing a layer of Ti/TiN, deposited to a thickness between about 2,000 to 5,000 Angstrom.

8. The method of claim 1 wherein said performing a second anneal comprises performing a low temperature anneal performed by rapid thermal annealing in a temperature range of between about 600 and 850 degrees C. for a time between about 20 and 60 seconds.

9. The method of claim 1 wherein said second removing un-reacted salicide material from said layer of filler material comprises performing a selective wet etch.

10. The method of claim 1 wherein said third anneal comprises rapid thermal annealing in a temperature range of between about 850 and 1000 degrees C. for a time between about 20 and 60 seconds.

11. A method of fabricating field effect transistors having low sheet resistance gate electrodes, comprising the steps of:

providing a semiconductor substrate, said substrate having been provided with at least one gate electrode created over an active region as said substrate as defined by regions of Shallow Trench Isolation provided in the said substrate, said at least one gate electrode having been provided with gate spacers, impurity implants of source and drain regions in addition to Lightly Doped Diffusion regions having been provided in said substrate self-aligned with said at least one gate electrode, said at least one gate electrode comprising a stack of layers of pad oxide created over said substrate, a layer of polysilicon patterned over the layer of pad oxide and a layer of boronitride patterned over the layer of polysilicon;

depositing a thin layer of Ti/TiN over said substrate, including said gate spacers and said layer of polysilicon provided for said at least one gate electrode, deposited to a thickness between about 100 and 500 Angstrom;

performing a low temperature anneal of said deposited thin layer of Ti/TiN in a temperature range of between about 600 and 850 degrees C. for a time between about 20 and 60 seconds, creating a layer of $TiSi_x$ over said source and drain implants, leaving uncreated Ti/TiN in place over said Shallow Trench Isolation regions;

removing said uncreated Ti/TiN from said substrate by performing a selective wet etch;

depositing a layer of silicon oxide over said substrate, including said gate spacers and said layer of boronitride provided for said at least one gate electrode;

depositing a layer of photoresist over said layer of silicon oxide to a thickness such that said layer of photoresist extends above said layer of silicon oxide even where said silicon oxide overlays said at least one gate electrode;

polishing said layer photoresist and said layer of silicon oxide down to said layer of boronitride being part of at least one gate electrode, using said layer of boronitride as a stop for said process of polishing;

removing said layer of boronitride from said at least one gate electrode by applying an Reactive Ion Etch, exposing said layer of polysilicon forming part of said at least one gate electrode;

depositing a thick layer of Ti/TiN over said polished layer of photoresist, including the exposed surface of said layer of polysilicon, deposited to a thickness between about 2,000 to 5,000 Angstrom;

performing an anneal of said deposited thick layer of Ti/TiN by rapid thermal annealing in a temperature range of between about 600 and 850 degrees C. for a time between about 20 and 60 seconds, creating a layer of $TiSi_x$ overlying said layer of polysilicon of said at least one gate electrode;

removing un-reacted Ti/TiN from said layer of photoresist by performing a selective wet etch;

performing an anneal of said layer of $TiSi_x$ overlying said layer of polysilicon of said at least one gate electrode, comprising a rapid thermal annealing in a temperature range of between about 850 and 1000 degrees C. for a time between about 20 and 60 seconds, reducing sheet resistance of said reacted salicide material overlying said layer of polysilicon of said at least one gate electrode.

* * * * *